(12) United States Patent
Zhang et al.

(10) Patent No.: US 11,762,407 B1
(45) Date of Patent: Sep. 19, 2023

(54) SIGNAL PROCESSING APPARATUS AND CONTROL METHOD

(71) Applicant: Halo Microelectronics International, Campbell, CA (US)

(72) Inventors: Gangqiang Zhang, Plano, TX (US); Zhao Fang, Plano, TX (US); Wenchao Qu, Plano, TX (US)

(73) Assignee: Halo Microelectronics International, Campbell, CA (US)

( * ) Notice: Subject to any disclaimer, the term of this patent is extended or adjusted under 35 U.S.C. 154(b) by 0 days.

(21) Appl. No.: 17/814,375

(22) Filed: Jul. 22, 2022

(51) Int. Cl.
| | |
|---|---|
| *H03K 17/687* | (2006.01) |
| *G05F 1/56* | (2006.01) |
| *G01R 19/00* | (2006.01) |
| *G01R 1/20* | (2006.01) |

(52) U.S. Cl.
CPC .............. *G05F 1/56* (2013.01); *G01R 1/203* (2013.01); *G01R 19/0092* (2013.01); *H03K 17/6872* (2013.01)

(58) Field of Classification Search
None
See application file for complete search history.

(56) References Cited

U.S. PATENT DOCUMENTS

| | | | | |
|---|---|---|---|---|
| 7,348,800 | B2* | 3/2008 | Koto | H03K 3/356104 |
| | | | | 326/82 |
| 8,169,226 | B2* | 5/2012 | Muller | G01R 27/18 |
| | | | | 324/713 |
| 8,598,936 | B2* | 12/2013 | Kuge | H03K 19/003 |
| | | | | 327/333 |
| 9,041,367 | B2* | 5/2015 | Dao | G05F 1/573 |
| | | | | 323/273 |
| 9,243,601 | B2* | 1/2016 | Reichow | H02J 7/1423 |
| 9,966,941 | B2* | 5/2018 | Dhamdhere | H03K 17/302 |
| 10,186,944 | B2* | 1/2019 | Lin | H02M 3/33507 |
| 11,146,268 | B2* | 10/2021 | Yamaji | H03K 17/08128 |
| 2012/0068755 | A1* | 3/2012 | Yamamoto | H03K 3/356113 |
| | | | | 327/333 |
| 2021/0006242 | A1* | 1/2021 | Takagiwa | G01R 19/0092 |
| 2022/0052535 | A1* | 2/2022 | Yamazaki | H02J 7/0029 |

* cited by examiner

*Primary Examiner* — Thomas J. Hiltunen
(74) *Attorney, Agent, or Firm* — AP3 Law Firm PLLC

(57) ABSTRACT

A signal processing apparatus includes a signal processing circuit configured to process a signal obtained from a voltage bus, a high voltage circuit configured to withstand a voltage stress when a high voltage is applied to the voltage bus, and a bypass circuit configured to bypass the high voltage circuit when a low voltage is applied to the voltage bus.

18 Claims, 7 Drawing Sheets

SIGNAL PROCESSING APPARATUS AND CONTROL METHOD

TECHNICAL FIELD

The present invention relates to a signal processing apparatus, and, in particular embodiments, to a current sense apparatus suitable for both high and low voltage applications.

BACKGROUND

As technologies further advance, a variety of integrated circuits have been used in the automotive industry. Integrated circuits play a critical role in modern automobiles for a variety of functions including safety, driver assistance, electrification, communication, connectivity and the like. Each function requires at least one power management integrated circuit that is responsible for the conversion, distribution and detection of electrical energy. For example, a power management integrated circuit (PMIC) is able to convert a voltage/current into power that can be used by various integrated circuits including processors, memory, input/output devices and the like.

As power consumption has continued to go up rapidly, there may be a need for accurately monitoring the current flowing through a power management integrated circuit. A plurality of current sense circuits have been used. FIG. 1 illustrates a traditional current sense circuit. A current sense resistor Rsns is in series with a voltage bus VIN. The current Io to be detected flows through Rsns. A resistor R1 is connected to Rsns. An amplifier U1 has a non-inverting input connected to a first terminal of Rsns through R1, and an inverting input connected to a second terminal of Rsns. The current sense circuit further comprises a current mirror formed by transistors MN1 and MN2. A gate of MN1 and a gate of MN2 are connected together and further connected to an output of the amplifier U1. A drain of MN1 is connected to a common node of R1 and U1. A drain of MN2 is configured to generate a signal proportional to a current flowing through Rsns. A source of MN1 and a source of MN2 are connected together and further connected to ground.

According to the operating principle of U1, there is an equivalent short circuit between the two input terminals of the amplifier U1. The amplifier U1 controls the current I1 such that the voltage across Rsns is the same as the voltage across R1. In other words, the current I1 flowing through MN1 is controlled by the amplifier U1. Since the voltage across Rsns is the same as the voltage across R1, I1 and I can satisfy the following equation:

$$I1 \times R1 = Io \times Rsns \quad (1)$$

Assuming the ratio of the current mirror is 1:1, the relationship between the output current Isns and the current Jo flowing through Rsns can be expressed as:

$$Io = Isns \times R1 / Rsns \quad (2)$$

The current sense circuit may be used in an application that needs to support a high-voltage power input (e.g., 40 V). It is difficult for the amplifier U1 shown in FIG. 1 to operate within a wide input voltage range up to 40 V. As such, it is necessary to have a current sense circuit supporting a higher and wider voltage input range.

FIG. 2 illustrates a traditional high voltage current sense circuit. The current sense circuit shown in FIG. 2 is similar to that shown in FIG. 1 except that a high voltage circuit formed by MP1 and MP2 is included. The high voltage circuit is capable of withstanding high voltage so that the voltage applied to the amplifier U2 is controlled within a low and narrow range.

As shown in FIG. 2, PMOS transistors MP1 and MP2 and corresponding dc bias current sources IB1 and IB2 are respectively added. MP1 and IB1 are connected in series in a first circuit branch coupled to a first terminal of Rsns. MP2 and IB2 are connected in series in a second circuit branch coupled to a second terminal of Rsns. Since the MOS semiconductor process can withstand a very high voltage, under suitable bias conditions, the majority of the high voltage (e.g., voltage at one terminal of Rsns) can be carried between the drain and source of MP1 and MP2. As a result, the voltage at the inputs of amplifier U2 is kept in a lower voltage range.

In some applications, Q1 and Q2 are not included in the traditional high voltage current sense circuit. In other words, R1 is connected to MP1 directly. Rsns is connected to MP2 directly. Under this system configuration, once the source voltages of MP1 and MP2 have a voltage difference, the corresponding source-gate voltages VSG1 and VSG2 are different. In response to the source-gate voltage difference, the currents I2 and I3 flowing through MP1 and MP2 are different. The current difference is amplified through the amplifier U2. The amplified current difference is used to drive the gate of MN1 to change the current I1 until the two currents I2 and I3 are equal. At this time, VSG1 is equal to VSG2. That is, the source voltages of MP1 and MP2 are equal. Similar to the circuit in FIG. 1, the amplifier U2 controls the current I1 such that the voltage across Rsns is equal to the voltage across R1. The circuit shown in FIG. 2 can satisfy Equations (1) and (2) above.

As described above, the process used to fabricate the PMOS transistors MP1 and MP2 can withstand high voltage. However, the matching between the drain-source current and the source-to-gate voltage is not good. For example, when the currents of MP1 and MP2 are equal, the source voltages of MP1 and MP2 may be not equal due to a fixed offset. This drawback can be overcome through adding bipolar transistors Q1 and Q2 into the current sense circuit as shown in FIG. 2. Although bipolar transistors have a limited ability to withstand high voltage, the matching between the base-emitter voltage $V_{BE}$ and collector current of bipolar transistor is good.

As shown in FIG. 2, Q1 is connected in series with MP1. Q2 is connected in series with MP2. The amplifier U2 is configured to force the collector currents equal to each other. At this time, the base-emitter voltage of Q1 is equal to the base-emitter voltage of Q2. The bases of Q1 and Q2 are connected to each other. The emitter voltages of Q1 and Q2 are equal. In this way, the currents I1 and Jo can satisfy Equation (1). The introduction of transistors Q1 and Q2 overcomes the error caused by the possible mismatch between MP1 and MP2, thereby improving the accuracy of the current sense circuit.

The circuit shown in FIG. 2 cannot support some application having a wide input voltage range (e.g., from 1.0 V to 40 V). Specifically, the minimum input voltage that the circuit shown in FIG. 2 can operate is equal to the sum of $V_{R1}$, $V_{EBQ1}$, $V_{THMP1}$ and $V_{SATIB1}$. $V_{R1}$ represents the voltage drop across the resistor R1. $V_{EBQ1}$ represents the emitter-base voltage when the BJT transistor is turned on. This voltage is about 0.7 V. $V_{THMP1}$ represents the turn-on threshold voltage of the high-voltage PMOS MP1. This voltage is close to 1.0 V. $V_{SATIB1}$ represents the minimum drain-source voltage difference required for the MOSFET used to achieve current bias IB1 to maintain saturation conduction. This voltage is about 0.3 V. The sum of these four voltages is about 2.0 V. When the input voltage is less than 2.0 V, the current source IB1 can no longer provide an accurate bias current because the drain-source voltage of the NMOS transistor is less than the saturated drain-source voltage $V_{SATIB1}$. As a result, the current sense circuit cannot operate correctly.

The minimum input voltage that the circuit in FIG. 2 can operate with is about 2 volts. In automotive applications, the input supply voltage may be as low as 1 volt. In order to meet the requirements of both the high-voltage and low-voltage applications, the traditional solution has to include a second current sense circuit specially designed for the lowest input voltage range. The second current sense circuit may be placed in parallel with the current sense circuit shown in FIG. 2. Such a parallel structure of the current sense circuit not only has a complex circuit occupying a large chip area and consuming extra power, but also has a transition issue when the input voltage is in an overlapped range. It is desirable to have a simple and reliable apparatus and control method to effectively detect current in an application having a wide input voltage range.

SUMMARY

These and other problems are generally solved or circumvented, and technical advantages are generally achieved, by preferred embodiments of the present disclosure which provide a current sense apparatus suitable for both high and low voltage applications.

In accordance with an embodiment, a signal processing apparatus comprises a signal processing circuit configured to process a signal obtained from a voltage bus, a high voltage circuit configured to withstand a voltage stress when a high voltage is applied to the voltage bus, and a bypass circuit configured to bypass the high voltage circuit when a low voltage is applied to the voltage bus.

In accordance with another embodiment, a method comprises detecting a voltage on a first terminal of a current sense resistor, when the voltage on the first terminal of the current sense resistor is greater than a predetermined threshold, configuring a current sense circuit and a high voltage circuit to detect a current flowing through the current sense resistor, and generate a signal proportional to the current flowing through the current sense resistor, and when the voltage on the first terminal of the current sense resistor is less than the predetermined threshold, bypassing the high voltage circuit and configuring the current sense circuit to detect the current flowing through the current sense resistor, and generate the signal proportional to the current flowing through the current sense resistor.

In accordance with yet another embodiment, a system comprises a current sense resistor having a first terminal coupled to an input of a voltage bus, and a second terminal coupled to an output of the voltage bus, a current sense circuit configured to sense a current flowing through the current sense resistor, a low voltage detection circuit configured to detect a voltage applied to the voltage bus, a high voltage circuit configured to withstand a voltage stress when a detected voltage is higher than a predetermined threshold, a bypass circuit configured to bypass the high voltage circuit when the detected voltage is less than the predetermined threshold, and a voltage bias circuit configured to provide bias voltages for the current sense circuit, the high voltage circuit and the bypass circuit.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a current sense apparatus suitable for both high and low voltage applications. The invention may also be applied, however, to a variety of signal processing systems and devices. Hereinafter, various embodiments will be explained in detail with reference to the accompanying drawings.

Figure 1:
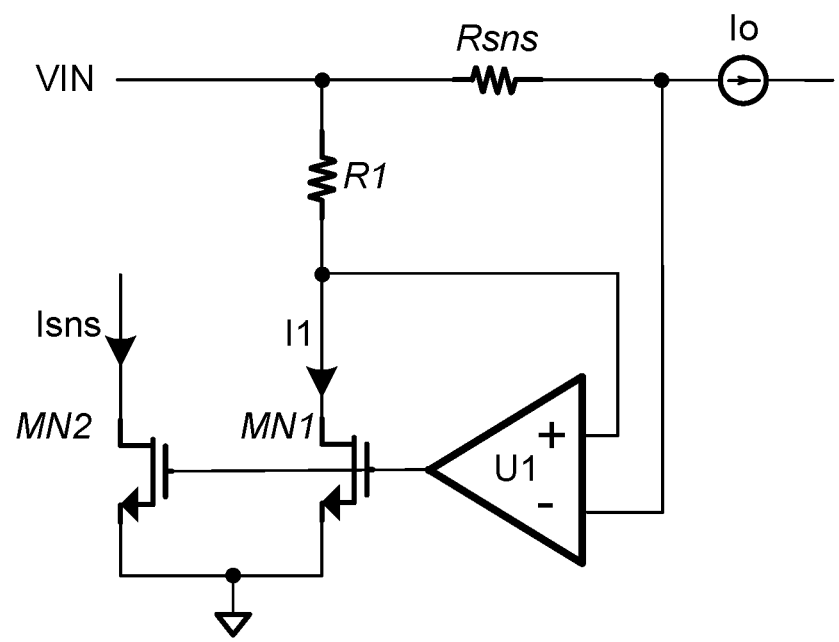
FIG. 1 illustrates a traditional current sense circuit.
Figure 2:
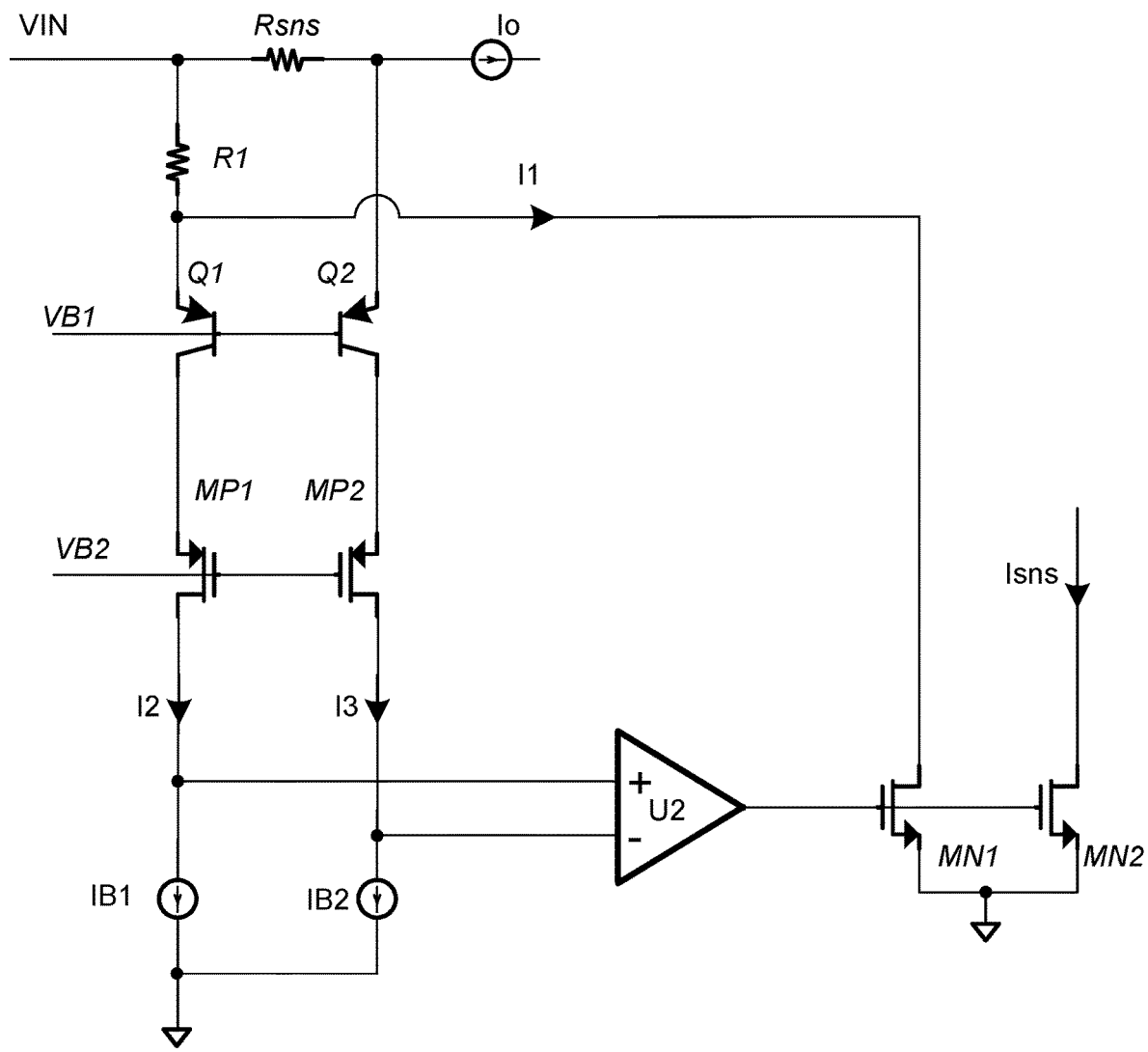
FIG. 2 illustrates a traditional high voltage current sense circuit.
Figure 3:
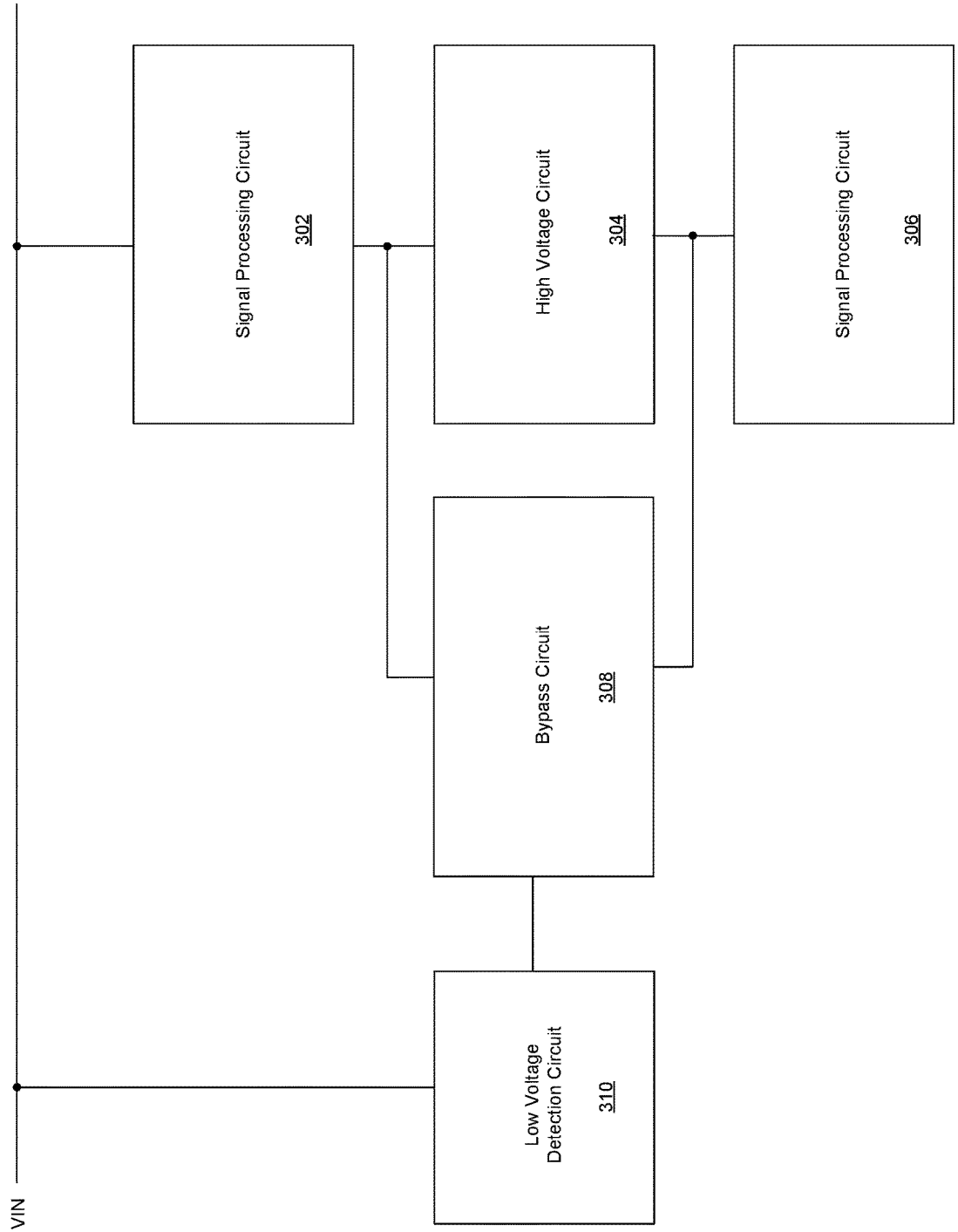
FIG. 3 illustrates a block diagram of a signal processing apparatus in accordance with various embodiments of the present disclosure.

FIG. 3 illustrates a block diagram of a signal processing apparatus in accordance with various embodiments of the present disclosure. A signal processing apparatus is coupled to a voltage bus VIN. The signal processing apparatus comprises a first signal processing circuit 302, a high voltage circuit 304, a second signal processing circuit 306, a bypass circuit 308 and a low voltage detection circuit 310. The first signal processing circuit 302 and the second signal processing circuit 306 are employed to fulfil the same function (e.g., current sensing, voltage sensing, any combinations thereof). Throughout the description, the first signal processing circuit 302 and the second signal processing circuit 306 may be collectively referred to as a signal processing circuit. In operation, the signal processing circuit is configured to process a signal obtained from the voltage bus.

The high voltage circuit 304 comprises a plurality of high voltage transistors. In some embodiments, the high voltage transistors are implemented as high voltage PMOS transistors. The high voltage PMOS transistors are configured to withstand the voltage stress when a high voltage is applied to the voltage bus VIN.

The bypass circuit 308 comprises a plurality of NMOS transistors. Each NMOS transistor is connected in parallel with a corresponding high voltage PMOS transistor. In operation, when a low voltage is applied to the voltage bus VIN, the bypass circuit 308 is able to bypass the high voltage circuit 304 through turning on the plurality of NMOS transistors.

The high voltage circuit 304 and the signal processing circuit are connected in series as shown in FIG. 3. The high voltage circuit 304 is configured to withstand the voltage stress when a high voltage is applied to the voltage bus VIN. As a result of having the high voltage circuit 304, the voltage applied to the signal processing circuit is controlled within a range suitable for the signal processing circuit to operate. On the other hand, when a low voltage is applied to the voltage bus VIN, the voltage drop across the high voltage circuit 304 may cause an inadequate voltage for the signal processing circuit. The low voltage detection circuit 310 is able to detect this low voltage and activate the bypass circuit 308 to bypass the high voltage circuit 304. Once the high voltage circuit 304 has been bypassed, more voltage can be applied to the signal processing circuit.

Figure 4:
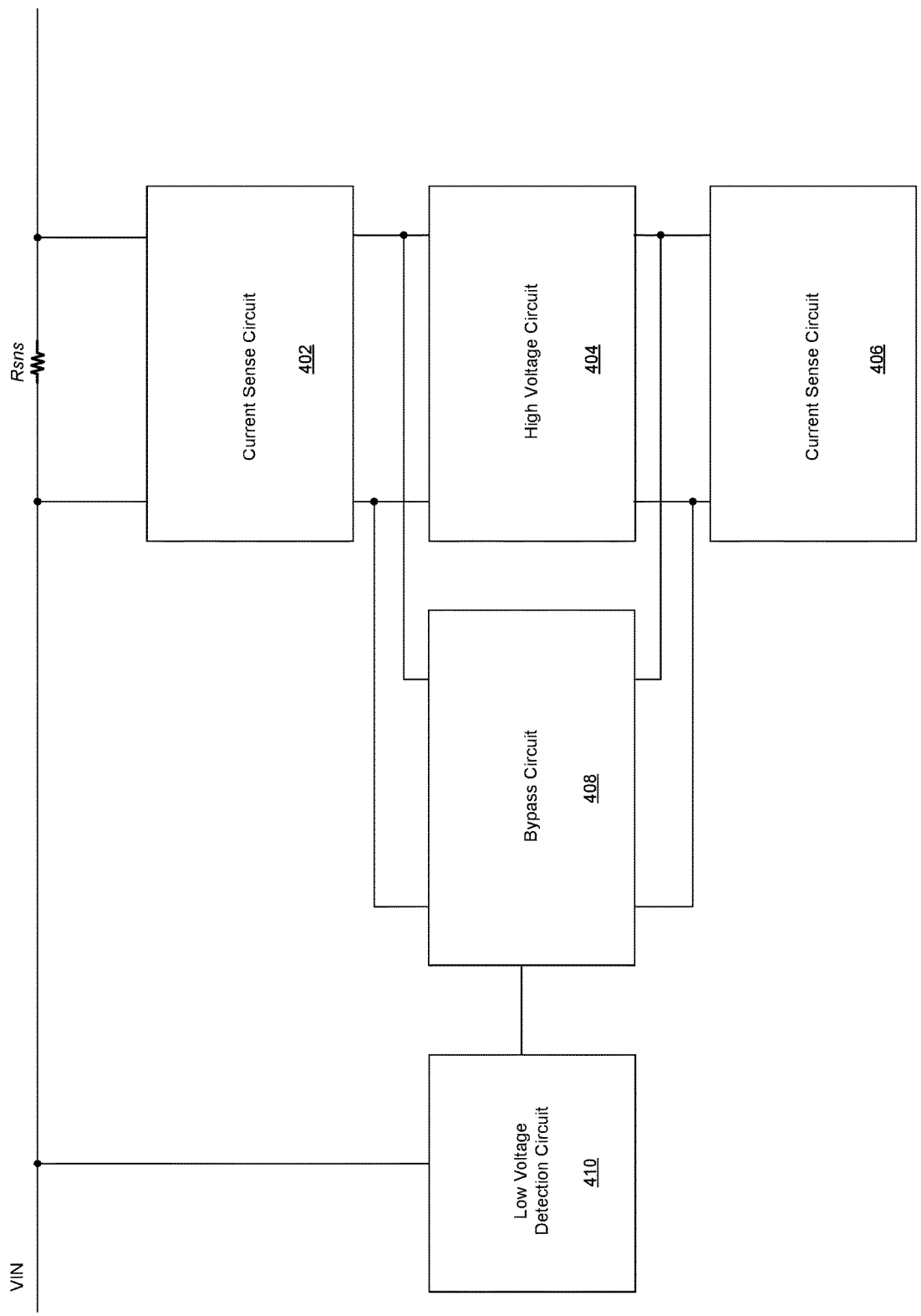
FIG. 4 illustrates a block diagram of a current sense apparatus in accordance with various embodiments of the present disclosure.

FIG. 4 illustrates a block diagram of a current sense apparatus in accordance with various embodiments of the present disclosure. The block diagram shown in FIG. 4 is similar to that shown in FIG. 3 except that the signal processing circuit is employed to detect a current flowing through the voltage bus VIN. In order to accurately detect the current, a current sense resistor Rsns is connected in series with the voltage bus. As shown in FIG. 4, a first current sense circuit 402, a high voltage circuit 404 and a second current sense circuit 406 are connected in series. A bypass circuit 408 is connected in parallel with the high voltage circuit 404. A low voltage detection circuit 410 is connected between the voltage bus and the bypass circuit 408. The detailed operating principle of these circuits will be discussed below with respect to FIGS. 5-6.

Figure 5:
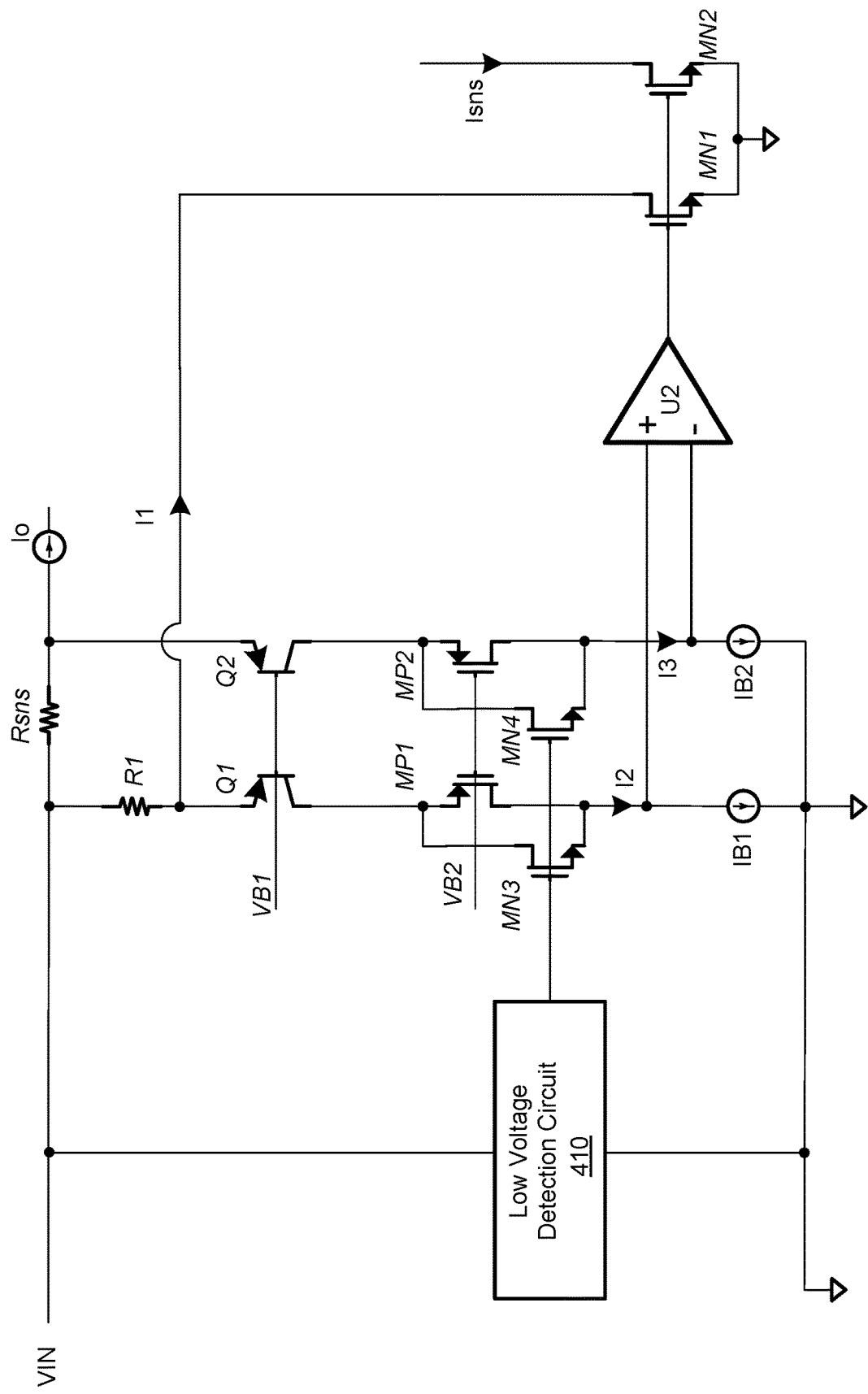
FIG. 5 illustrates a schematic diagram of a first implementation of the current sense apparatus shown in FIG. 4 in accordance with various embodiments of the present disclosure.

FIG. 5 illustrates a schematic diagram of a first implementation of the current sense apparatus shown in FIG. 4 in accordance with various embodiments of the present disclosure. The current sense apparatus comprises a current sense circuit, a high voltage circuit, a bypass circuit and a low voltage detection circuit. As shown in FIG. 5, the high voltage circuit comprises a first high voltage transistor MP1 and a second high voltage transistor MP2. The bypass circuit comprises a first bypass transistor MN3 and a second bypass transistor MN4. The current sense circuit comprises a first resistor R1, a transistor pair comprising a first transistor Q1 and a second transistor Q2, a first current source IB1, a second current source IB2, an amplifier U2 and a current mirror comprising a first current mirror transistor MN1 and a second current mirror transistor MN2.

The first resistor R1 is connected to a first terminal of the current sense resistor Rsns. The first transistor Q1 is connected between the first resistor R1 and MP1 of the high voltage circuit. As shown in FIG. 5, the first transistor Q1 is a first p-type bipolar transistor having an emitter connected to the first resistor R1 and a collector connected to MP1 of the high voltage circuit. The second transistor Q2 is connected between a second terminal of the current sense resistor Rsns and MP2 of the high voltage circuit. As shown in FIG. 5, the second transistor Q2 is a second p-type bipolar transistor having an emitter connected to the second terminal of the current sense resistor Rsns and a collector connected to MP2 of the high voltage circuit. The base of the first transistor Q1 and the base of the second transistor Q2 are connected together and further connected to a first bias voltage VB1.

The first current source IB1 is connected between the high voltage circuit and ground. The second current source IB2 is connected between the high voltage circuit and ground. The amplifier U2 has a non-inverting input connected to a common node of the first current source IB1 and the high voltage circuit, and an inverting input connected to a common node of the second current source IB2 and the high voltage circuit. A gate of the first current mirror transistor MN1 and a gate of the second current mirror transistor MN2 are connected together and further connected to an output of the amplifier U2. A drain of the first current mirror transistor MN1 is connected to a common node of the first resistor R1 and the first transistor Q1. A drain of the second current mirror transistor MN2 is configured to generate a signal proportional to the current flowing through Rsns. A source of the first current mirror transistor MN1 and a source of the second current mirror transistor MN2 are connected together and further connected to ground.

As shown in FIG. 5, a gate of the first high voltage transistor MP1 and a gate of the second high voltage transistor MP2 are connected together and further connected to a second bias voltage VB2. A source of the first high voltage transistor MP1 is connected to the first transistor Q1. A drain of the first high voltage transistor MP1 is connected to the first current source IB1. A source of the second high voltage transistor MP2 is connected to the second transistor Q2. A drain of the second high voltage transistor MP2 is connected to the second current source IB2.

As shown in FIG. 5, the first bypass transistor MN3 is connected in parallel with the first high voltage transistor MP1. The second bypass transistor MN4 is connected in parallel with the second high voltage transistor MP2. The gate of the first bypass transistor MN3 and the gate of the second bypass transistor MN4 are connected together and further connected to an output of the low voltage detection circuit 410.

In operation, when the low voltage detection circuit 410 detects that the input voltage drops to the lowest acceptable operating voltage of the current sense apparatus, the low voltage detection circuit 410 is able to generate gate control signals to turn on bypass transistors MN3 and MN4. As a result of turning on MN3 and MN4, the high voltage PMOS transistors MP1 and MP2 are short-circuited. Once MP1 and MP2 are short-circuited, the minimum input power supply voltage at which the circuit shown in FIG. 5 can operate normally is reduced to the sum of the sum of $V_{R1}$, $V_{EBQ1}$ and $V_{SATIB1}$. $V_{R1}$ represents the voltage drop across the resistor R1. $V_{EBQ1}$ represents the emitter-base voltage when the bipolar transistor Q1 is turned on. This voltage is about 0.7 V. $V_{SAT}$IB1 represents the minimum drain-source voltage difference required for the MOSFET used to achieve current bias IB1 to maintain saturation conduction. This voltage is about 0.3 V. The sum of these three voltages is about 1.0 V. This voltage can meet the needs of the minimum input voltage for automotive applications.

On the other hand, when the input voltage is higher than a preset threshold for high voltage applications, the low voltage detection circuit 410 is configured to generate gate control signals to turn off MN3 and MN4. Once MN3 and MN4 are turned off, the high voltage PMOS transistors MP1 and MP2 are connected into the current sense circuit. MP1 and MP2 function as a voltage divider to adapt to the high voltage input.

One advantageous feature of having the bypass circuit is, by bypassing the high voltage circuit, the current sense apparatus is able to operate in a wider input voltage range. As mentioned above, the minimum operating voltage requirement of the current sense apparatus shown in FIG. 5 mainly comes from the turn-on voltage of the high-voltage PMOS transistors MP1 and MP2. After having the bypass circuit, the drawback of the high voltage circuit can be overcome. More particularly, when the input voltage is not high enough to maintain the operation of the high voltage circuit and the current sense circuit, the high voltage circuit is short-circuited, thereby providing more voltage for the current sense circuit.

Figure 6:
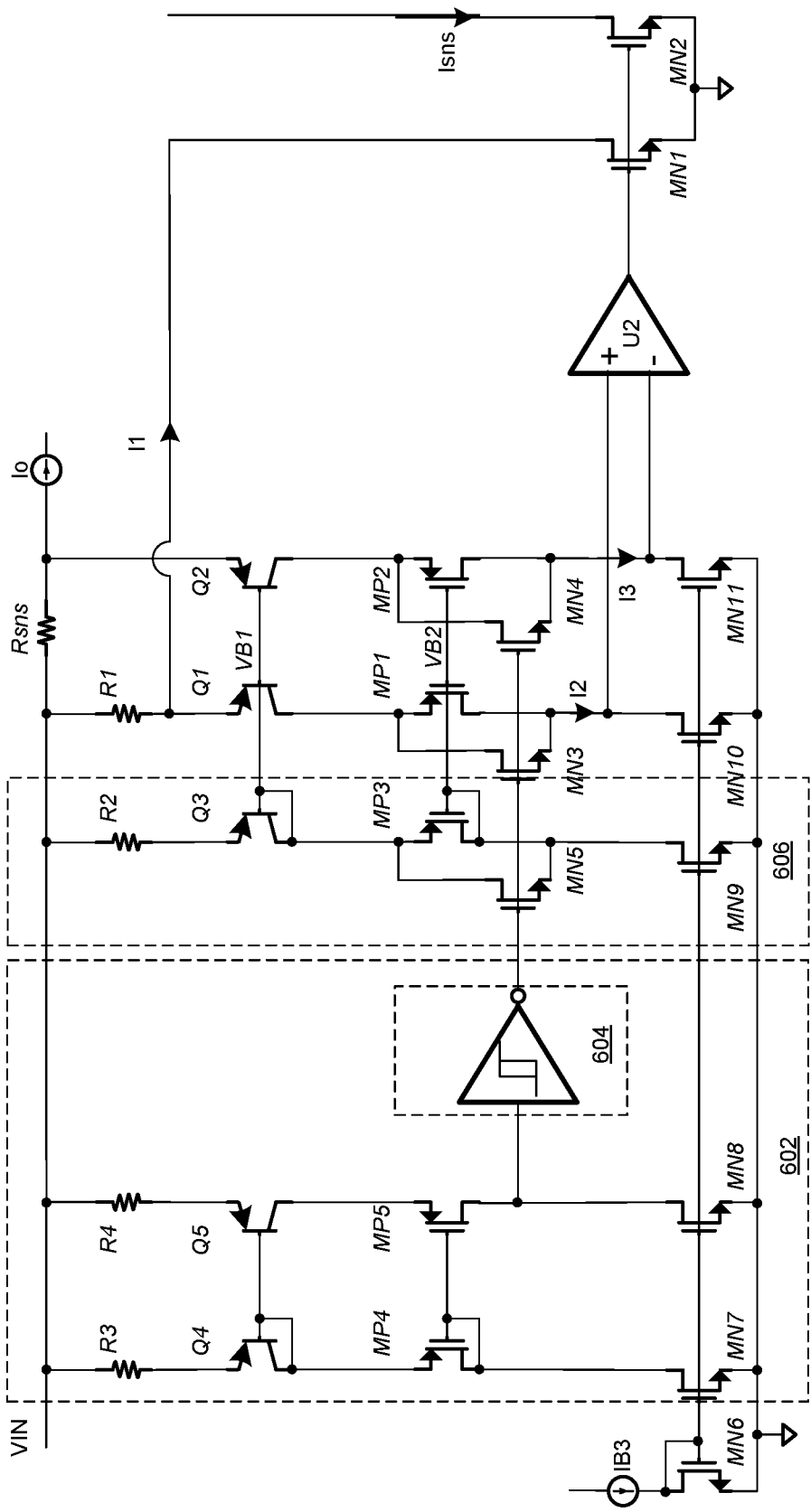
FIG. 6 illustrates a schematic diagram of a second implementation of the current sense apparatus shown in FIG. 4 in accordance with various embodiments of the present disclosure.

FIG. 6 illustrates a schematic diagram of a second implementation of the current sense apparatus shown in FIG. 4 in accordance with various embodiments of the present disclosure. The second implementation of the current sense apparatus shown in FIG. 6 is similar to that shown in FIG. 5 except that the implementations of the voltage bias circuit 606, the current bias circuit and the low voltage detection circuit 602 are included.

The voltage bias circuit 606 is coupled between the voltage bus VIN and ground. The voltage bias circuit 606 is configured to provide the first bias voltage VB1 and the second bias voltage VB2 for the current sense circuit.

The voltage bias circuit comprises a second resistor R2, a third transistor Q3, a third high voltage transistor MP3, a third bypass transistor MN5 and a first current bias transistor MN9. As shown in FIG. 6, the second resistor R2, the third transistor Q3, the third high voltage transistor MP3 and the first current bias transistor MN9 are connected in series between the voltage bus VIN and ground.

The third bypass transistor MN5 is connected in parallel with the third high voltage transistor MP3. In operation, when the input voltage is lower than the preset threshold, MN5, MN3 and MN4 are turned on at the same time to short-circuit MP3, MP1 and MP2. By short-circuiting MP3, the voltage bias circuit 606 can continue to provide a suitable bias voltage for the current sense circuit when the input voltage is lower than the preset threshold.

The resistance value of R2 depends on the range of the detected current. Proper selection of R2 can ensure that the voltage bias circuit 606 can provide a suitable bias voltage for the current sense circuit within all the detection current ranges that need to be supported. In some embodiments, the resistance value of resistor R2 can be equal to that of resistor R1.

The third transistor Q3 is a bipolar transistor similar to Q1 and Q2. A base and a collector of the third transistor Q3 are connected together and further connected to the bases of Q1 and Q2. As shown in FIG. 6, the third transistor Q3 is diode-connected and its base is connected to the bases of Q1 and Q2. Q3 is configured to provide a bias voltage VB1 for Q1 and Q2. In some embodiments, the bias voltage VB1 is configured such that the conduction of Q1 and Q2 can be maintained in a wide input voltage range.

A gate and a drain of the third high voltage transistor MP3 is connected together. Furthermore, the gate of the third high voltage transistor MP3 is connected to the gates of MP1 and MP2. Likewise, a gate of the third bypass transistor MN5 is connected to the gates of MN3 and MN4. The gate and drain of MP3 are short-circuited and connected to the gates of MP1 and MP2, thereby providing the bias voltage VB2 for MP1 and MP2 to maintain the saturation conduction of MP1 and MP2.

The current sense circuit comprises a first resistor R1, a transistor pair comprising a first transistor Q1 and a second transistor Q2, a second current bias transistor MN10, a third current bias transistor MN11, an amplifier U2 and a current mirror comprising a first current mirror transistor MN1 and a second current mirror transistor MN2.

The first resistor R1 is connected to a first terminal of the current sense resistor Rsns. The first transistor Q1 is connected between the first resistor R1 and MP1 of the high voltage circuit. The second transistor Q2 is connected between a second terminal of the current sense resistor Rsns and MP2 of the high voltage circuit. A base of the first transistor Q1 and a base of the second transistor Q2 are connected together and further connected to the base of the third transistor Q3.

The second current bias transistor MN10 is connected between MP1 of the high voltage circuit and ground. A gate of the second current bias transistor MN10 is connected to the gate of the first current bias transistor MN9. The third current bias transistor MN11 is connected between MP2 of the high voltage circuit and ground. A gate of the third current bias transistor is connected to the gate of the first current bias transistor MN9.

The amplifier U2 has a non-inverting input connected to a common node of the second current bias transistor MN10 and the high voltage circuit, and an inverting input connected to a common node of the third current bias transistor MN11 and the high voltage circuit. A gate of the first current mirror transistor MN1 and a gate of the second current mirror transistor MN2 are connected together and further connected to an output of the amplifier U2. A drain of the first current mirror transistor MN1 is connected to a common node of the first resistor R1 and the first transistor Q1. A drain of the second current mirror transistor MN2 is configured to generate a signal proportional to the current flowing through Rsns. A source of the first current mirror transistor MN1 and a source of the second current mirror transistor MN2 are connected together and further connected to ground.

The low voltage detection circuit 602 is coupled between the voltage bus VIN and ground. The low voltage detection circuit 602 comprises a first current branch, a second current branch and a Schmitt trigger 604. The first current branch comprises a third resistor R3, a fourth transistor Q4, a first voltage detection transistor MP4 and a fourth current bias transistor MN7 connected in series between the voltage bus VIN and ground. In some embodiments, the resistance value of R3 is equal to that of R1. The second current branch comprises a fourth resistor R4, a fifth transistor Q5, a second voltage detection transistor MP5 and a fifth current bias transistor MN8 connected in series between the voltage bus and ground. In some embodiments, the resistance value of R4 is equal to that of R1. As shown in FIG. 6, Q4 and Q5 are implemented as bipolar transistors similar to Q1, Q2 and Q3. A base and a collector of the fourth transistor Q4 are connected together and further connected to a base of the fifth transistor Q5. A gate and a drain of the first voltage detection transistor MP4 are connected together and further connected to a gate of the second voltage detection transistor MP5. An input of the Schmitt trigger 604 is connected to a common node of the second voltage detection transistor MP5 and the fifth current bias transistor MN8. An output of the Schmitt trigger 604 is connected to the gates of the first bypass transistor MN3, the second bypass transistor MN4 and the third bypass transistor MN5.

The current bias circuit comprises the first current bias transistor MN9, the second current bias transistor MN10, the third current bias transistor MN11, the fourth current bias transistor MN7, the fifth current bias transistor MN8 and the sixth current bias transistor MN6. As shown in FIG. 6, the sixth current bias transistor MN6 is connected between a bias current source IB3 and ground. A gate and a drain of the sixth current bias transistor MN6 is connected together and further connected to the gates of the first current bias transistor MN9, the second current bias transistor MN10, the third current bias transistor MN11, the fourth current bias transistor MN7 and the fifth current bias transistor MN8. The bias current IB3 is mirrored to the current sense circuit, the voltage bias circuit and the low voltage detection circuit, respectively, to provide suitable current bias. In some embodiments, MOS transistors MN6, MN7, MN9, MN10, and MN11 can choose the same size to keep the current bias uniform, while the size of MOS transistor MN8 needs to be smaller than MN7 to provide a bias current smaller than MN7.

In operation, the size mismatch of MN7 and MN8 helps the Schmitt trigger 604 correctly detect the input voltage. In some embodiments, MN7 has a larger area than MN8. The current on the first current branch through MN7 is greater than the current mirrored on the second current branch through MN8. When the input voltage is high, both current branches can keep MN7, MN8, MP4, and MP5 in saturation conduction. The input voltage of the Schmitt trigger is equal to the difference of VIN and the sum of $V_{R4}$, $V_{EBQ5}$ and $V_{THPM5}$. $V_{R4}$ represents the voltage drop across the resistor R4. $V_{EBQ5}$ represents the emitter-base voltage of Q5. $V_{THMP5}$ represents the turn-on threshold voltage of the high-voltage PMOS MP5. When the input voltage is high, the voltage fed into the Schmitt trigger 604 is of a high level. The Schmitt trigger 604 outputs a signal of a low level. MN3, MN4 and MN5 remain off. MP1, MP2 and MP3 are in series with the current sense circuit, and continue to divide the input voltage VIN. When the input voltage VIN is lower than the minimum operating voltage required by both current branches, neither MN7 nor MN8 has sufficient drain-source voltage difference to maintain saturation conduction, and the current flowing through both current paths decreases. However, since the area of MN7 is larger than that of MN8, the current in the first current branch decreases more greatly, thereby reducing the pull-up current mirrored to the second current branch. In the second current branch, the pull-down current is greater than the pull-up current. The input voltage of the Schmitt trigger is pulled low by the pull-down current provided by MN8. The Schmitt trigger generates a signal of a high level, and then MN3, MN4 and MN5 are turned on to short-circuit MP1, MP2 and MP3.

As shown in FIG. 6, the structure of the second current branch (R4, Q5, MP5 and MN8) is similar to that of the current sense circuit. When the input voltage VIN gradually decreases, the time point when the input voltage VIN of the second current branch is insufficient is close to the time point when the input voltage of the current sense circuit is too low. The short circuit of MP1, MP2 and MP3 can be completed just when the current detection circuit needs it, so as to realize a smooth transition between circuit structures supporting high and low input voltage ranges.

It should be noted the diagram shown in FIG. 6 is merely an example, which should not unduly limit the scope of the claims. One of ordinary skill in the art would recognize many variations, alternatives, and modifications. For example, MP1-MP5 can also be implemented as BJT transistors. The high voltage can be achieved through connecting a plurality of BJT transistors in series. Furthermore, Q1-Q5 can be implemented as MOS transistors. Moreover, depending on different design needs, Q1-Q5 can be removed.

Figure 7:
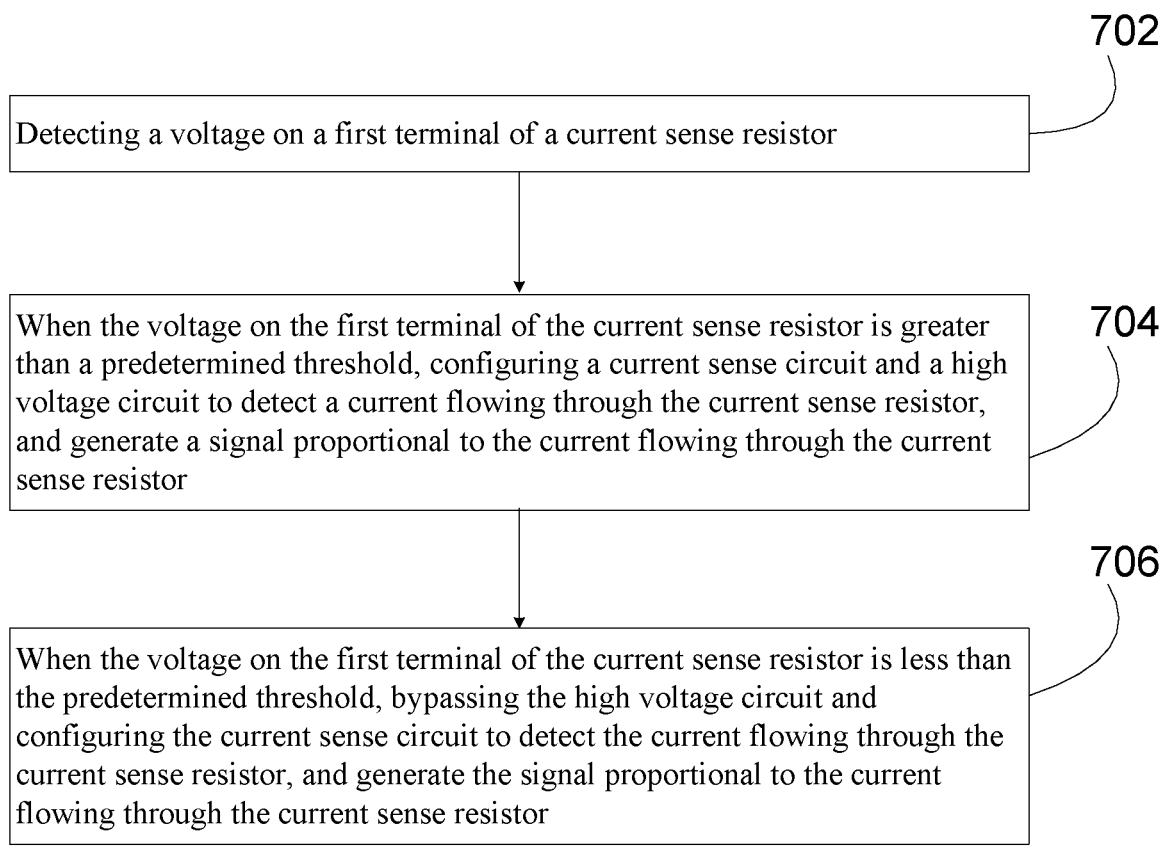
FIG. 7 illustrates a flow chart of a control method for operating the current sense apparatus shown in FIG. 4 in accordance with various embodiments of the present disclosure.

FIG. 7 illustrates a flow chart of a control method for operating the current sense apparatus shown in FIG. 4 in accordance with various embodiments of the present disclosure. This flowchart shown in FIG. 7 is merely an example, which should not unduly limit the scope of the claims. One of ordinary skill in the art would recognize many variations, alternatives, and modifications. For example, various steps illustrated in FIG. 7 may be added, removed, replaced, rearranged and repeated.

Referring back to FIG. 4, the current sense apparatus comprises a current sense resistor, a current sense circuit, a low voltage detection circuit, a high voltage circuit and a bypass circuit. The current sense resistor has a first terminal coupled to an input of a voltage bus, and a second terminal coupled to an output of the voltage bus. The current sense circuit is configured to sense a current flowing through the current sense resistor. The low voltage detection circuit is configured to detect a voltage applied to the voltage bus. The high voltage circuit configured to withstand a voltage stress when a detected voltage is higher than a predetermined threshold. The bypass circuit configured to bypass the high voltage circuit when the detected voltage is less than the predetermined threshold.

At step 702, the low voltage detection circuit is configured to detect a voltage on the first terminal of the current sense resistor.

At step 704, when the voltage on the first terminal of the current sense resistor is greater than a predetermined threshold, the current sense circuit and the high voltage circuit are configured to detect a current flowing through the current sense resistor and generate a signal proportional to the current flowing through the current sense resistor.

At step 706, when the voltage on the first terminal of the current sense resistor is less than the predetermined threshold, the high voltage circuit is bypassed and the current sense circuit is configured to detect the current flowing through the current sense resistor and generate the signal proportional to the current flowing through the current sense resistor.

The method further comprises activating a bypass circuit to bypass the high voltage circuit, configuring a voltage bias circuit to provide bias voltages for the current sense circuit, the bypass circuit and the high voltage circuit, configuring a low voltage detection circuit to detect the voltage on the first terminal of the current sense resistor and configuring a current bias circuit to provide bias currents for the current sense circuit, the bypass circuit and the high voltage circuit.

The voltage bias circuit comprises a second resistor, a third transistor, a third high voltage transistor, a third bypass transistor and a first current bias transistor. The second resistor, the third transistor, the third high voltage transistor and the first current bias transistor are connected in series between the first terminal of the current sense resistor and ground. The third high voltage transistor is connected in parallel with the third bypass transistor.

The current sense circuit comprises a first resistor connected to the first terminal of the current sense resistor, a first transistor and a second transistor. The first transistor is connected between the first resistor and the high voltage circuit. The second transistor is connected between a second terminal of the current sense resistor and the high voltage circuit. A control terminal of the first transistor and a control terminal of the second transistor are connected together and further connected to a control terminal of the third transistor. The current sense circuit comprises a second current bias transistor connected between the high voltage circuit and ground. A control terminal of the second current bias transistor is connected to a control terminal of the first current bias transistor. The current sense circuit comprises a third current bias transistor connected between the high voltage circuit and ground. A control terminal of the third current bias transistor is connected to the control terminal of the first current bias transistor. The current sense circuit comprises an amplifier having a non-inverting input connected to a common node of the second current bias transistor and the high voltage circuit, and an inverting input connected to a common node of the third current bias transistor and the high voltage circuit. The current sense circuit comprises a current mirror comprising a first current mirror transistor and a second current mirror transistor. A gate of the first current mirror transistor and a gate of the second current mirror transistor are connected together and further connected to an output of the amplifier. A drain of the first current mirror transistor is connected to a common node of the first resistor and the first transistor. A drain of the second current mirror transistor is configured to generate a signal proportional to the current flowing through the current sense resistor. A source of the first current mirror transistor and a source of the second current mirror transistor are connected together and further connected to ground.

The high voltage circuit comprises a first high voltage transistor and a second high voltage transistor. A gate of the first high voltage transistor and a gate of the second high voltage transistor are connected together and further connected to a gate of the third high voltage transistor. A source of the first high voltage transistor is connected to the first transistor. A drain of the first high voltage transistor is connected to the second current bias transistor. A source of the second high voltage transistor is connected to the second transistor. A drain of the second high voltage transistor is connected to the third current bias transistor.

The bypass circuit comprises a first bypass transistor and a second bypass transistor. The first bypass transistor is connected in parallel with the first high voltage transistor. The second bypass transistor is connected in parallel with the second high voltage transistor.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
    a signal processing circuit configured to process a signal obtained from a voltage bus, wherein the signal processing circuit is a current sense circuit configured to sense a current flowing through the voltage bus;
    a high voltage circuit configured to withstand a voltage stress when a high voltage is applied to the voltage bus, wherein the high voltage circuit is coupled between the voltage bus and ground;
    a bypass circuit configured to bypass the high voltage circuit when a low voltage is applied to the voltage bus;
    a low voltage detection circuit coupled between the voltage bus and ground, wherein the low voltage detection circuit is configured to generate signals to control the bypass circuit so as to bypass the high voltage circuit; and
    a current sense resistor connected in series with the voltage bus.

2. The apparatus of claim 1, wherein the current sense circuit comprises:
    a first resistor connected to a first terminal of the current sense resistor;
    a transistor pair comprising a first transistor and a second transistor, and wherein the first transistor is connected between the first resistor and the high voltage circuit, and the second transistor is connected between a second terminal of the current sense resistor and the high voltage circuit;
    a first current source connected between the high voltage circuit and ground;
    a second current source connected between the high voltage circuit and ground;
    an amplifier having a non-inverting input connected to a common node of the first current source and the high voltage circuit, and an inverting input connected to a common node of the second current source and the high voltage circuit; and
    a current mirror comprising a first current mirror transistor and a second current mirror transistor, and wherein:
        a gate of the first current mirror transistor and a gate of the second current mirror transistor are connected together and further connected to an output of the amplifier;
        a drain of the first current mirror transistor is connected to a common node of the first resistor and the first transistor;
        a drain of the second current mirror transistor is configured to generate a signal proportional to the current flowing through the voltage bus; and
        a source of the first current mirror transistor and a source of the second current mirror transistor are connected together and further connected to ground.

3. The apparatus of claim 2, wherein:
the first transistor is a first p-type bipolar transistor having an emitter connected to the first resistor and a collector connected to the high voltage circuit; and
the second transistor is a second p-type bipolar transistor having an emitter connected to the second terminal of the current sense resistor and a collector connected to the high voltage circuit.

4. The apparatus of claim 2, wherein:
the high voltage circuit comprises a first high voltage transistor and a second high voltage transistor, and wherein:
a gate of the first high voltage transistor and a gate of the second high voltage transistor are connected together;
a source of the first high voltage transistor is connected to the first transistor;
a drain of the first high voltage transistor is connected to the first current source;
a source of the second high voltage transistor is connected to the second transistor; and
a drain of the second high voltage transistor is connected to the second current source.

5. The apparatus of claim 4, wherein:
the bypass circuit comprises a first bypass transistor and a second bypass transistor, and wherein:
the first bypass transistor is connected in parallel with the first high voltage transistor; and
the second bypass transistor is connected in parallel with the second high voltage transistor.

6. The apparatus of claim 1, further comprising:
a voltage bias circuit coupled between the voltage bus and ground, wherein the voltage bias circuit comprises a second resistor, a third transistor, a third high voltage transistor, a third bypass transistor and a first current bias transistor, and wherein:
the second resistor, the third transistor, the third high voltage transistor and the first current bias transistor are connected in series between the voltage bus and ground;
the third bypass transistor is connected in parallel with the third high voltage transistor;
a control terminal of the third high voltage transistor is connected to control terminals of high voltage transistors in the high voltage circuit; and
a control terminal of the third bypass transistor is connected to control terminals of bypass transistors in the bypass circuit.

7. The apparatus of claim 6, wherein the current sense circuit comprises:
a first resistor connected to a first terminal of the current sense resistor connected in series with the voltage bus;
a transistor pair comprising a first transistor and a second transistor, and wherein:
the first transistor is connected between the first resistor and the high voltage circuit;
the second transistor is connected between a second terminal of the current sense resistor and the high voltage circuit; and
a control terminal of the first transistor and a control terminal of the second transistor are connected together and further connected to a control terminal of the third transistor;
a second current bias transistor connected between the high voltage circuit and ground, and wherein a control terminal of the second current bias transistor is connected to a control terminal of the first current bias transistor;
a third current bias transistor connected between the high voltage circuit and ground, and wherein a control terminal of the third current bias transistor is connected to the control terminal of the first current bias transistor;
an amplifier having a non-inverting input connected to a common node of the second current bias transistor and the high voltage circuit, and an inverting input connected to a common node of the third current bias transistor and the high voltage circuit; and
a current mirror comprising a first current mirror transistor and a second current mirror transistor, and wherein:
a gate of the first current mirror transistor and a gate of the second current mirror transistor are connected together and further connected to an output of the amplifier;
a drain of the first current mirror transistor is connected to a common node of the first resistor and the first transistor;
a drain of the second current mirror transistor is configured to generate a signal proportional to a current flowing through the voltage bus; and
a source of the first current mirror transistor and a source of the second current mirror transistor are connected together and further connected to ground.

8. The apparatus of claim 7, further comprising:
a low voltage detection circuit coupled between the voltage bus and ground, wherein the low voltage detection circuit comprises a first current branch, a second current branch and a Schmitt trigger, and wherein:
the first current branch comprises a third resistor, a fourth transistor, a first voltage detection transistor and a fourth current bias transistor connected in series between the voltage bus and ground;
the second current branch comprises a fourth resistor, a fifth transistor, a second voltage detection transistor and a fifth current bias transistor connected in series between the voltage bus and ground;
a control terminal of the fourth transistor and a control terminal of the fifth transistor are connected together;
a control terminal of the first voltage detection transistor and a control terminal of the second voltage detection transistor are connected together;
an input of the Schmitt trigger is connected to a common node of the second voltage detection transistor and the fifth current bias transistor; and
an output of the Schmitt trigger is connected to the control terminal the third bypass transistor.

9. The apparatus of claim 8, further comprising:
a sixth current bias transistor connected between a bias current source and ground, wherein a control terminal of the sixth current bias transistor is connected to control terminals of the first current bias transistor, the second current bias transistor, the third current bias transistor, the fourth current bias transistor and the fifth current bias transistor, and wherein the first current bias transistor, the second current bias transistor, the third current bias transistor, the fourth current bias transistor, the fifth current bias transistor and the sixth current bias transistor form a current bias circuit.

10. The apparatus of claim 8, wherein:
the fourth current bias transistor and the fifth current bias transistor are configured such that a silicon area of the fourth current bias transistor is greater than a silicon area of the fifth current bias transistor, and based on this silicon area difference, the Schmitt trigger is configured to generate a low voltage signal when the high voltage is applied to the voltage bus, and generate a high voltage signal when the low voltage is applied to the voltage bus.

11. A method comprising:
detecting a voltage on a first terminal of a current sense resistor;
when the voltage on the first terminal of the current sense resistor is greater than a predetermined threshold, configuring a current sense circuit and a high voltage circuit to detect a current flowing through the current sense resistor, and generate a signal proportional to the current flowing through the current sense resistor; and
when the voltage on the first terminal of the current sense resistor is less than the predetermined threshold, bypassing the high voltage circuit and configuring the current sense circuit to detect the current flowing through the current sense resistor, and generate the signal proportional to the current flowing through the current sense resistor.

12. The method of claim 11, further comprising:
activating a bypass circuit to bypass the high voltage circuit;
configuring a voltage bias circuit to provide bias voltages for the current sense circuit, the bypass circuit and the high voltage circuit;
configuring a low voltage detection circuit to detect the voltage on the first terminal of the current sense resistor; and
configuring a current bias circuit to provide bias currents for the current sense circuit, the bypass circuit and the high voltage circuit.

13. The method of claim 12, wherein:
the voltage bias circuit comprises a second resistor, a third transistor, a third high voltage transistor, a third bypass transistor and a first current bias transistor, and wherein:
the second resistor, the third transistor, the third high voltage transistor and the first current bias transistor are connected in series between the first terminal of the current sense resistor and ground; and
the third bypass transistor is connected in parallel with the third high voltage transistor.

14. The method of claim 13, wherein the current sense circuit comprises:
a first resistor connected to the first terminal of the current sense resistor;
a first transistor and a second transistor, and wherein:
the first transistor is connected between the first resistor and the high voltage circuit;
the second transistor is connected between a second terminal of the current sense resistor and the high voltage circuit; and
a control terminal of the first transistor and a control terminal of the second transistor are connected together and further connected to a control terminal of the third transistor;
a second current bias transistor connected between the high voltage circuit and ground, and wherein a control terminal of the second current bias transistor is connected to a control terminal of the first current bias transistor;
a third current bias transistor connected between the high voltage circuit and ground, and wherein a control terminal of the third current bias transistor is connected to the control terminal of the first current bias transistor;
an amplifier having a non-inverting input connected to a common node of the second current bias transistor and the high voltage circuit, and an inverting input connected to a common node of the third current bias transistor and the high voltage circuit; and
a current mirror comprising a first current mirror transistor and a second current mirror transistor, and wherein:
a gate of the first current mirror transistor and a gate of the second current mirror transistor are connected together and further connected to an output of the amplifier;
a drain of the first current mirror transistor is connected to a common node of the first resistor and the first transistor;
a drain of the second current mirror transistor is configured to generate a signal proportional to the current flowing through the current sense resistor; and
a source of the first current mirror transistor and a source of the second current mirror transistor are connected together and further connected to ground.

15. The method of claim 14, wherein:
the high voltage circuit comprises a first high voltage transistor and a second high voltage transistor, and wherein:
a gate of the first high voltage transistor and a gate of the second high voltage transistor are connected together and further connected to a gate of the third high voltage transistor;
a source of the first high voltage transistor is connected to the first transistor;
a drain of the first high voltage transistor is connected to the second current bias transistor;
a source of the second high voltage transistor is connected to the second transistor; and
a drain of the second high voltage transistor is connected to the third current bias transistor; and
the bypass circuit comprises a first bypass transistor and a second bypass transistor, and wherein:
the first bypass transistor is connected in parallel with the first high voltage transistor; and
the second bypass transistor is connected in parallel with the second high voltage transistor.

16. A system comprising:
a current sense resistor having a first terminal coupled to an input of a voltage bus, and a second terminal coupled to an output of the voltage bus;
a current sense circuit configured to sense a current flowing through the current sense resistor;
a low voltage detection circuit coupled configured to detect a voltage applied to the voltage bus;
a high voltage circuit configured to withstand a voltage stress when a detected voltage is higher than a predetermined threshold;
a bypass circuit configured to bypass the high voltage circuit when the detected voltage is less than the predetermined threshold; and
a voltage bias circuit configured to provide bias voltages for the current sense circuit, the high voltage circuit and the bypass circuit.

17. The system of claim 16, wherein:
the voltage bias circuit comprises a second resistor, a third transistor, a third high voltage transistor, a third bypass transistor and a first current bias transistor, and wherein:

the second resistor, the third transistor, the third high voltage transistor and the first current bias transistor are connected in series between the first terminal of the current sense resistor and ground; and the third bypass transistor is connected in parallel with the third high voltage transistor; and the current sense circuit comprises:

a first resistor connected to the first terminal of the current sense resistor;

a first transistor and a second transistor, and wherein:
the first transistor is connected between the first resistor and the high voltage circuit;
the second transistor is connected between a second terminal of the current sense resistor and the high voltage circuit; and
a control terminal of the first transistor and a control terminal of the second transistor are connected together and further connected to a control terminal of the third transistor;

a second current bias transistor connected between the high voltage circuit and ground, and wherein a control terminal of the second current bias transistor is connected to a control terminal of the first current bias transistor;

a third current bias transistor connected between the high voltage circuit and ground, and wherein a control terminal of the third current bias transistor is connected to the control terminal of the first current bias transistor;

an amplifier having a non-inverting input connected to a common node of the second current bias transistor and the high voltage circuit, and an inverting input connected to a common node of the third current bias transistor and the high voltage circuit; and a current mirror comprising a first current mirror transistor and a second current mirror transistor, and wherein:
a gate of the first current mirror transistor and a gate of the second current mirror transistor are connected together and further connected to an output of the amplifier;
a drain of the first current mirror transistor is connected to a common node of the first resistor and the first transistor;
a drain of the second current mirror transistor is configured to generate a signal proportional to the current flowing through the voltage bus; and
a source of the first current mirror transistor and a source of the second current mirror transistor are connected together and further connected to ground.

18. The system of claim 17, wherein:

the high voltage circuit comprises a first high voltage transistor and a second high voltage transistor, and wherein:
a gate of the first high voltage transistor and a gate of the second high voltage transistor are connected together and further connected to a gate of the third high voltage transistor;
a source of the first high voltage transistor is connected to the first transistor;
a drain of the first high voltage transistor is connected to the second current bias transistor;
a source of the second high voltage transistor is connected to the second transistor; and
a drain of the second high voltage transistor is connected to the third current bias transistor;

the bypass circuit comprises a first bypass transistor and a second bypass transistor, and wherein:
the first bypass transistor is connected in parallel with the first high voltage transistor; and
the second bypass transistor is connected in parallel with the second high voltage transistor; and the low voltage detection circuit comprises a first current branch, a second current branch and a Schmitt trigger, and wherein:
the first current branch comprises a third resistor, a fourth transistor, a first voltage detection transistor and a fourth current bias transistor connected in series between the voltage bus and ground;
the second current branch comprises a fourth resistor, a fifth transistor, a second voltage detection transistor and a fifth current bias transistor connected in series between the voltage bus and ground;
a control terminal of the fourth transistor and a control terminal of the fifth transistor are connected together;
a control terminal of the first voltage detection transistor and a control terminal of the second voltage detection transistor are connected together;
an input of the Schmitt trigger is connected to a common node of the second voltage detection transistor and the fifth current bias transistor; and
an output of the Schmitt trigger is connected to the control terminal the third bypass transistor.

* * * * *